(12) United States Patent
Yuan et al.

(10) Patent No.: US 9,831,073 B2
(45) Date of Patent: Nov. 28, 2017

(54) LOW DEFLECTION SPUTTERING TARGET ASSEMBLY AND METHODS OF MAKING SAME

(71) Applicant: Tosoh SMD, Inc., Grove City, OH (US)

(72) Inventors: Yongwen Yuan, Dublin, OH (US); Eugene Y. Ivanov, Grove City, OH (US)

(73) Assignee: Tosoh SMD, Inc., Grove City, OH (US)

(*) Notice: Subject to any disclaimer, the term of this patent is extended or adjusted under 35 U.S.C. 154(b) by 344 days.

(21) Appl. No.: 14/376,950

(22) PCT Filed: Feb. 12, 2013

(86) PCT No.: PCT/US2013/025729
§ 371 (c)(1),
(2) Date: Aug. 6, 2014

(87) PCT Pub. No.: WO2013/122927
PCT Pub. Date: Aug. 22, 2013

(65) Prior Publication Data
US 2015/0170887 A1    Jun. 18, 2015

Related U.S. Application Data

(60) Provisional application No. 61/598,595, filed on Feb. 14, 2012.

(51) Int. Cl.
*C23C 14/34* (2006.01)
*H01J 37/34* (2006.01)
(Continued)

(52) U.S. Cl.
CPC ........ *H01J 37/3417* (2013.01); *B23K 1/0008* (2013.01); *B23K 20/002* (2013.01);
(Continued)

(58) Field of Classification Search
CPC .................. H01J 37/3417; C23C 14/3407
See application file for complete search history.

(56) References Cited

U.S. PATENT DOCUMENTS

| | | |
|---|---|---|
| 5,320,984 A | 6/1994 | Zhang et al. |
| 5,338,425 A | 8/1994 | Mishima et al. |

(Continued)

FOREIGN PATENT DOCUMENTS

| | | |
|---|---|---|
| CN | 1494602 A | 5/2004 |
| CN | 1520466 A | 8/2004 |

(Continued)

OTHER PUBLICATIONS

International Search Report and Written Opinion dated Apr. 30, 2013 for PCT/US2013/025729 filed Feb. 12, 2013.
(Continued)

*Primary Examiner* — John Brayton
(74) *Attorney, Agent, or Firm* — Wegman, Hessler & Vanderburg

(57) ABSTRACT

Described is a design and method for producing a sputtering target assembly with low deflection made from target material solder bonded to composite backing plate with coefficient of thermal expansion (CTE) matching the target material. The composite backing plate is composite configuration composed of at least two different materials with different CTE. The composite backing plate, after plastic deformation, if necessary, has a CTE matching the target material and low and desirable deflection in the bonding process, and therefore, resulting in a low deflection and low stress target material bonded to composite backing plate assembly. The method includes manufacturing composite backing plate with a flat bond surface, heat treating of target blank and composite backing plate to achieve desirable shape of bond surfaces, solder bonding target to a backing plate, and slowly cooling the assembly to room temperature. Matching CTE in
(Continued)

both target material and backing plate eliminates the problem of CTE mismatch and prevents the assembly from deflection and internal stress.

6 Claims, 4 Drawing Sheets

(51) Int. Cl.
| | | |
|---|---|---|
| *B23K 1/00* | (2006.01) | |
| *B23K 20/12* | (2006.01) | |
| *B23K 20/00* | (2006.01) | |
| *B23K 20/02* | (2006.01) | |
| *C25D 7/00* | (2006.01) | |
| *B23K 103/10* | (2006.01) | |
| *B23K 103/14* | (2006.01) | |
| *B23K 103/18* | (2006.01) | |
| *B23K 103/08* | (2006.01) | |
| *B23K 103/00* | (2006.01) | |

(52) U.S. Cl.
CPC ............ *B23K 20/02* (2013.01); *B23K 20/122* (2013.01); *B23K 20/129* (2013.01); *C25D 7/00* (2013.01); *H01J 37/3429* (2013.01); *B23K 2203/08* (2013.01); *B23K 2203/10* (2013.01); *B23K 2203/14* (2013.01); *B23K 2203/18* (2013.01); *B23K 2203/56* (2015.10)

(56) References Cited

U.S. PATENT DOCUMENTS

| | | | |
|---|---|---|---|
| 5,593,082 A | 1/1997 | Ivanov et al. | |
| 5,879,524 A | 3/1999 | Hurwitt et al. | |
| 5,965,278 A | 10/1999 | Finley et al. | |
| 6,071,389 A | 6/2000 | Zhang | |
| 6,183,613 B1 | 2/2001 | Gilman et al. | |
| 6,193,856 B1 | 2/2001 | Kida et al. | |
| 6,521,108 B1 | 2/2003 | Zhang | |
| 6,759,143 B2 | 7/2004 | Oda et al. | |
| 6,774,339 B1* | 8/2004 | Smathers ............. | B23K 1/0008 219/121.17 |
| 6,793,124 B1 | 9/2004 | Takahashi et al. | |
| 2004/0134776 A1 | 7/2004 | Misner et al. | |
| 2007/0062574 A1* | 3/2007 | Shiomi .............. | B23K 35/0272 136/256 |
| 2007/0205102 A1 | 9/2007 | Scholl et al. | |
| 2009/0045050 A1 | 2/2009 | Kuniya et al. | |
| 2009/0045051 A1 | 2/2009 | Ferrasse et al. | |
| 2009/0283573 A1 | 11/2009 | Shiomi et al. | |
| 2011/0303535 A1 | 12/2011 | Miller et al. | |

FOREIGN PATENT DOCUMENTS

| | | |
|---|---|---|
| CN | 1795565 A | 6/2006 |
| CN | 1849408 A | 10/2006 |
| CN | 101176960 A | 5/2008 |
| EP | 1 592 823 B1 | 4/2007 |
| JP | 57-188680 A | 11/1982 |
| JP | 4-168267 A | 6/1992 |
| JP | 08-246144 | 9/1996 |
| WO | WO 92/17622 A1 | 10/1992 |
| WO | WO 2004/065046 A2 | 8/2004 |
| WO | WO 2011/102896 A1 | 8/2011 |

OTHER PUBLICATIONS

International Preliminary Examination Report dated Aug. 28, 2014 for PCT/US2013/025729 filed Feb. 12, 2013.
The First Office Action and English translation dated Dec. 1, 2015 in CN 201380009377.7 filed Feb. 12, 2013.
The Second Office Action and English translation dated Oct. 8, 2016 in CN 201380009377.7 filed Feb. 12, 2013.

* cited by examiner

LOW DEFLECTION SPUTTERING TARGET ASSEMBLY AND METHODS OF MAKING SAME

CROSS REFERENCE TO RELATED APPLICATION

This PCT application claims the priority benefit of U.S. Provisional Patent Application Ser. No. 61/598,595 filed Feb. 14, 2012.

FIELD OF INVENTION

The present invention pertains to a sputter target and composite backing plate wherein the target and backing plate component located contiguous to the target are thermally matched with each other to minimize thermal stress occurring along the target/backing plate interface.

BACKGROUND OF THE INVENTION

Sputtering as a means to deposit thin films of a desired material on a substrate has become important in integrated circuits. In a sputtering system, material to be deposited on a substrate is removed from a sputter target by bombardment of the target with excited ions in the plasma state. Atoms or molecules of the target material are ejected from the target and are deposited on a workpiece or substrate. The ejection of these materials from the target is accompanied by significant heat build-up in the target area.

Normally, a sputtering system comprises a sputter source, a vacuum chamber, and means for positioning and holding the substrate in proximity to the sputter source. The sputter source normally comprises a target from which material is to be sputtered, means for holding the target in place, means for creating a plasma in the vicinity of the target, means for causing ions in the plasma to bombard the target, and means for cooling the target to prevent overheating.

Various means have been used in the past for holding sputter targets in place within the sputter sources. Such holding means must ensure that the target maintains good thermal contact with the cooling means so that heat generated in the target may be dissipated away.

In some sputter sources, circularly shaped targets are removably mounted within a fixed backing plate and are retained in place by various hold down features, such as clamps, springs, inserts, screws, etc. In these sputter source designs, the sputtering targets are independently removable from the fixed backing plates, for replacement of the targets due to target consumption, breakage, etc. Oftentimes, the target is soldered to the backing plate with the necessary requirement that the target be removed by melting the solder and separation of the target from the backing plate.

In order to cool the targets, cooling water is typically circulated alongside or through the backing plate positioned adjacent to the target. In some cases, the thermal contact between an outer rim of the target and the peripheral cooling wall of the backing plate is critical and is maintained by thermal expansion of the target against the cooling wall.

In other systems, when the target is replaced, both the spent target and the corresponding backing plate are discarded. The backing plate in such designs typically includes an upper annularly shaped planar surface adapted for flush receipt against the lower surface of the target. The backing plate further includes an annular ring extending downwardly from the planar surface having an outer mounting flange at the lower end of the annular ring. The target plate and backing plate may be joined via soldering, welding, brazing, or other metal bonding techniques.

Due to the differing coefficients of thermal expansion ("CTE") of the target and backing plate members, the high heat levels attained by the target during high power sputtering result in excessive stress exerted along the target/backing plate interface. Warpage and differential shrinkage of both target and backing plate members may occur despite the cooling function, resulting in severely impeded cooling of the target with attendant target failure.

SUMMARY OF THE INVENTION

In accordance with one exemplary aspect of the invention, thermal matching of target and backing plate members is accomplished by providing a target and a composite backing plate assembly. The composite backing plate is typically a laminated structure with a top backing plate layer superposed over a bottom backing plate layer. The CTEs of exemplary target or backing plate layer materials are given in terms of $Z \times 10^{-6}$ cm/cm/° C. at 20° C. wherein Z is the thermal expansion coefficient as listed below:

|  | Z (Thermal Expansion Coefficient) |
|---|---|
| Mo | 5.0 |
| MoSi$_2$ | 8.25 |
| Si | 2.49 |
| Ti | 8.4 |
| Al | 24.0 |
| Ag | 19.6 |
| Co | 12.5 |
| Cu | 16.4 |
| TaSi$_2$ | 8.8 |
| TiW | 4.0 |
| Zr | 5.8 |
| Ta | 6.5 |
| W | 4.4 |
| WSi$_2$ | 6.5 |
| Nb | 7.1 |
| Ni | 13.1 |
| V | 8.33 |

The target and top layer of the laminated backing plate, adapted for contiguous mating with the target, have a difference in their thermal expansion coefficients of about $22 \times 10^{-6}$ cm/cm/° C. or less. By provision of a matched target and backing plate, thermal stress at the target/backing plate interface and bowing of the assembly are minimized during joining and sputtering operation.

A laminated backing plate assembly is provided with the top layer of the backing plate defining an intermediate layer between the target and bottom backing plate layer. This intermediate layer is composed of a material that is thermally matched with the target material that is superposed thereover.

The invention will be further described in accordance with the appended drawings and following detailed description.

DETAILED DESCRIPTION OF EXEMPLARY EMBODIMENTS

Figure 1:
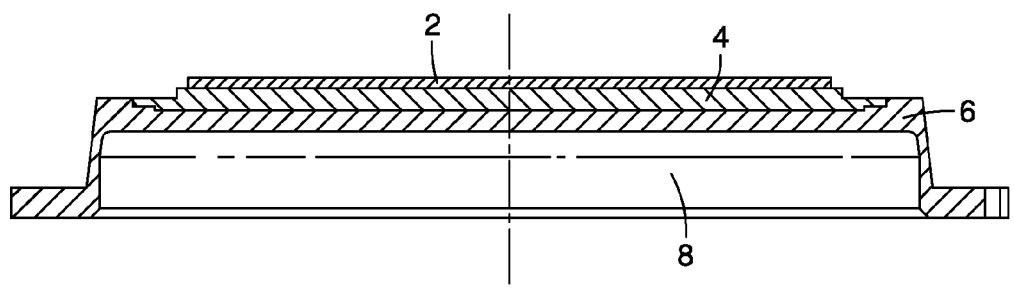
FIG. 1 is a schematic cross-sectional illustration of one embodiment of a target and laminated backing plate assembly in accordance with the invention.
Figure 3:
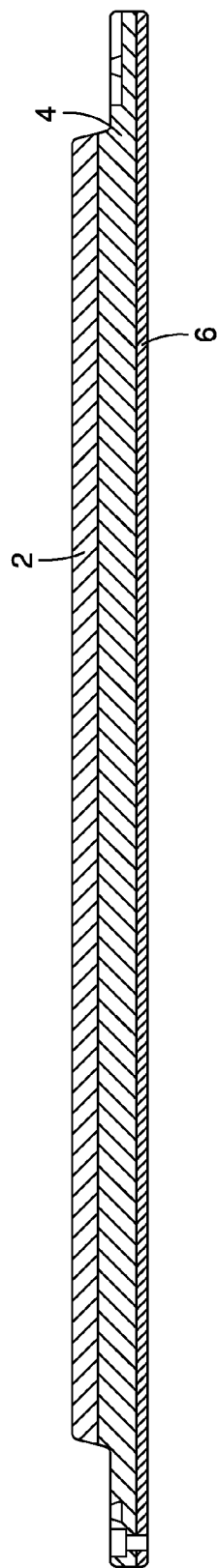
FIG. 3 is a schematic cross-sectional illustration of one embodiment of a target and laminated backing plate assembly in accordance with the invention.

Turning first to FIG. 1 and FIG. 3 of the drawings, target/backing plate assemblies are shown in accordance with one embodiment of the invention. The assembly comprises a target material 2 having a surface composed of the desired sputtering material. A laminated or composite backing plate assembly is shown and comprises a first material 4, defining a first or top layer of the backing plate assembly that is superposed over a second backing plate material, material 6. In FIG. 1, a cooling chamber 8 is provided in heat exchange relation with the bottom surface of the second backing plate material 6 so as to aid in cooling of the assembly during the sputtering operation. As shown, the materials 4 and 6 can be bonded along their interface by conventional means such as solder bonding, diffusion bonding, brazing, coating, electroplating, etc. The target 2 may be bonded to the top side of first material 4 of the backing plate assembly by conventional means such as solder bonding, diffusion bonding, brazing, friction stir welding (FSW), etc.

In accordance with one aspect of the invention, the CTEs of the target and the first material 4 are chosen so that they are compatible. Stated differently, the difference between the CTEs of the target 2 and first backing plate material 4 should be on the order of about 22 or less. In another embodiment, the difference between the CTEs may be 7 or less. Further, the CTE of the second material 6 of the laminated or composite backing plate assembly should be higher than the CTE of the material 4. Thus, upon heat treatment of the materials 4 and 6 such as in a bonding process or the like, a desired concavity can be formed along the top surface of the member 4. This concavity can serve as a reservoir for solder or the like, which is then used to bond the composite backing plate assembly to the target 2.

Figure 2:
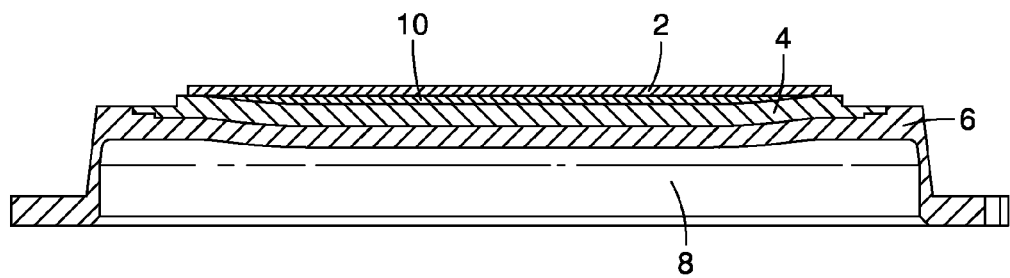
FIG. 2 is a schematic illustration of another embodiment in which a concavity or reservoir 10 is formed between the underside surface of the target and the top surface of the intermediate layer of the assembly during one stage of manufacture of the assembly.

With regard to FIG. 2, the concavity 10 is shown positioned along the top surface of first backing plate material 4. As shown in the drawing, the size of the concavity 10 is exaggerated for simplification purposes. Also, as shown in FIG. 2, liquid, such as heated solder or the like, is provided in the cavity as a bonding medium to bond the target 2 to the top surface of the first backing plate layer 4.

Figure 4:
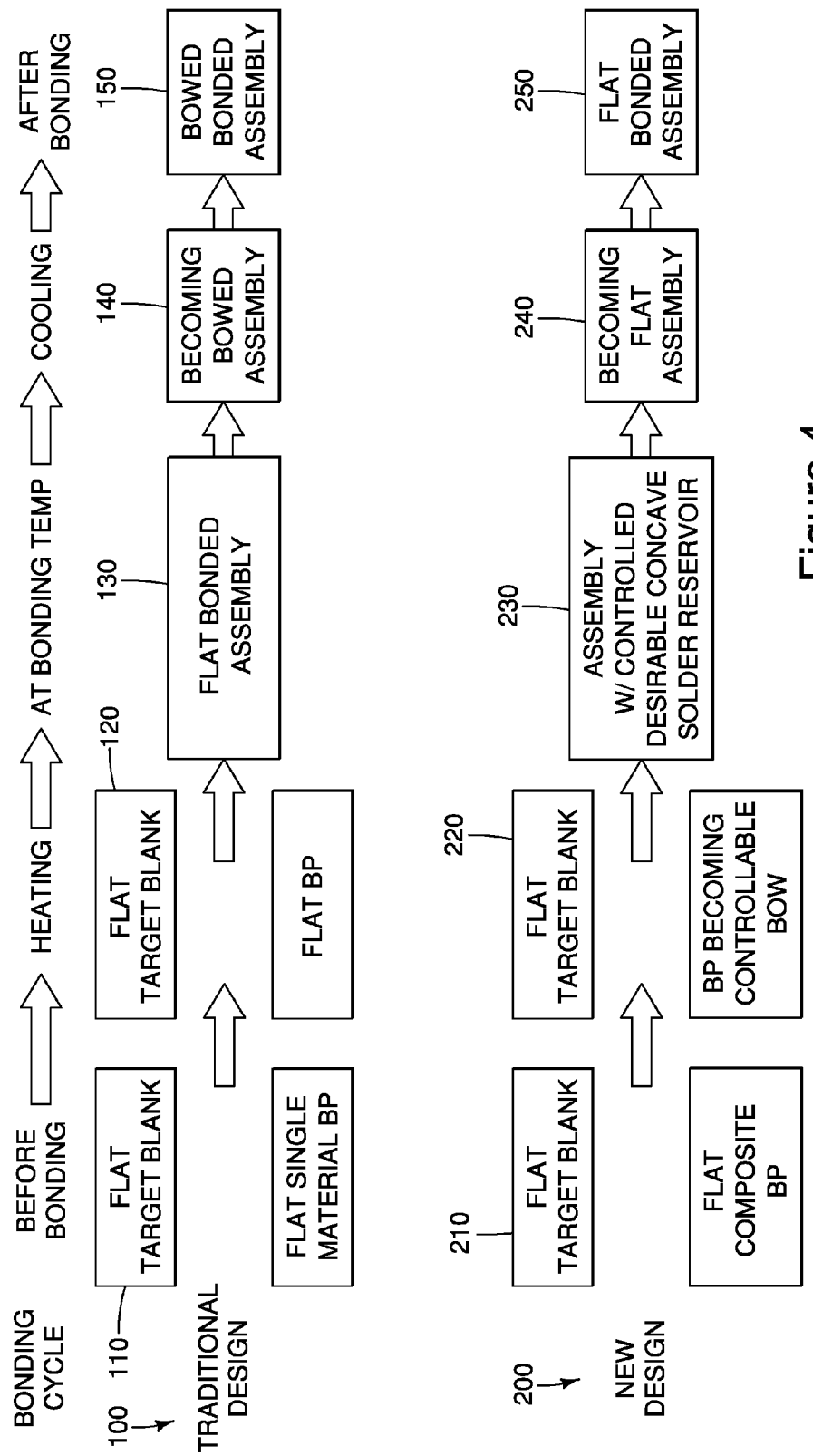
FIG. 4 is a process flow diagram contrasting a prior art target/backing plate manufacturing process and a target/backing plate manufacturing process in accordance with one aspect of the invention.

FIG. 4 contrasts a conventional design 100 target/backing plate bonding method with a method in accordance with the invention shown as 200. In the conventional methods, a flat target blank and flat single backing plate material are provided as shown at step 110. Then, the flat target blank and flat backing plate are heated as shown at 120 and bonded together as shown at 130 via conventional means forming a flat bonded target/backing plate assembly. Upon cooling, due to the large CTE difference between the target and the backing plate, the entire assembly bows or becomes deformed as shown at 140. After the bonding process is concluded, the result is a bowed bonded assembly as shown at 150.

In contrast, in accordance with one exemplary embodiment of the invention as shown at 210, a flat target blank is provided along with a flat laminated or composite backing plate of the type shown in FIG. 1 and FIG. 3. Then, the flat target blank and backing plate assemblies are heat treated as shown at 220. Due to the fact that the second material 6, as shown in FIG. 1, has a higher CTE than that provided in the first layer material, number 4, (FIG. 1), the backing plate assembly is warped into a controllable bowed position, and at the bonding temperature, this desirable concavity defines reservoir 10 shown in FIG. 2. This reservoir exists as a concavity along the top surface of first backing plate layer 4. Upon cooling as shown at 240 in FIG. 4, the entire assembly becomes flat, and after the bonding process, a flat bonded assembly 250 being provided.

It is accordingly apparent then, that the choice of backing plate components 4 and 6 are made based on the target material properties. The target material CTE should be close to the CTE of the first backing plate layer 4, and as aforementioned, in certain exemplary embodiments, this difference should be on the order of about 22 or less. In another embodiment, the difference between the CTEs may be 7 or less. Further, the CTE of second backing plate layer 6 is greater than the CTE of the first backing plate layer 4. This helps to naturally form a concave surface which also may serve as a reservoir for solder bonding of the target to the backing plate assembly such as shown in FIG. 2.

Figure 5:
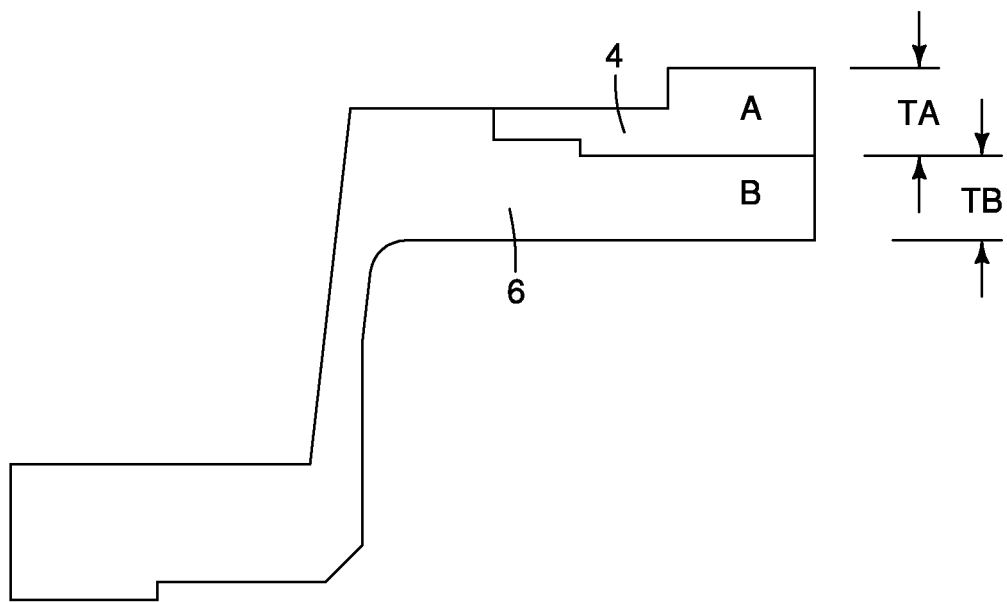
FIG. 5 is a fragmentary cross sectional illustration of one embodiment of the laminated or composite backing plate assembly and showing the thicknesses of the respective materials "A" and "B" that together define the composite backing plate assembly.

As illustrated in FIG. 5, different thickness ratios TA/TB may be chosen for the components 4, 6, respectively of the backing plate assembly so as to adjust the depth of the concave surface or reservoir 10.

The layers 4, 6 of the backing plate assembly can be bonded together via diffusion bonding, brazing, soldering, friction stir welding, coating, electroplating, and other conventional methods. The target manufacturing method includes manufacturing the composite backing plate with a flat bond surface, heating of the target surface and composite plate to achieve a desirable shape of the bond surfaces, and in certain embodiments, a solder bonding of the target to the backing plate followed by slowly cooling the assembly to room temperature.

In one exemplary embodiment, the target material 2 is Si, and the composite backing plate comprises top or first layer 4 of Ti and a second or bottom layer 6 of Al6061. The backing plate materials are diffusion bonded together with the Si target solder bonded to the composite backing plate.

Another exemplary embodiment that can be mentioned is a Si target with a composite backing plate wherein the first layer 4 is Mo, and the second layer 6 is Cu. The Cu layer may have a thickness of greater than or equal to zero millimeters. When the thickness of the second layer is zero, it indicates that only the first layer is present. In other words, when the Cu layer thickness is zero, the backing plate has only a first layer of Mo.

Another exemplary embodiment is a combination of a W target with a composite backing plate wherein the first backing plate layer 4 is Ti, and the second backing plate layer 6 is Al or Al alloys.

Another exemplary embodiment is a combination of a $WSi_2$ target with a composite backing plate wherein the first backing plate layer 4 is Ti and the second backing plate layer 6 is Al or Al alloys.

The CTEs of exemplary target or backing plate layer materials are given in terms of Z×10$^{-6}$ cm/cm/° C. at 20° C. wherein Z is the thermal expansion coefficient as listed below:

|       | Z (Thermal Expansion Coefficient) |
|-------|-----------------------------------|
| Mo    | 5.0                               |
| MoSi$_2$ | 8.25                           |
| Si    | 2.49                              |
| Ti    | 8.4                               |
| Al    | 24.0                              |
| Ag    | 19.6                              |
| Co    | 12.5                              |
| Cu    | 16.4                              |
| TaSi$_2$ | 8.8                            |
| TiW   | 4.0                               |
| Zr    | 5.8                               |
| Ta    | 6.5                               |
| W     | 4.4                               |
| WSi$_2$ | 6.5                             |
| Nb    | 7.1                               |
| Ni    | 13.1                              |
| V     | 8.33                              |

In other exemplary embodiments, the target can be silicon, ceramic materials (including and not limited to oxides, nitrides, carbides, etc.), silicon-germanium, silicide (e.g., WSi$_2$), and alloys thereof. The composite backing plate (members 4/6) may be composed of Ti/Al, Ti/Cu, Mo/Cu, Mo/Al, Ta/Al, Ta/Cu, etc. The materials 4/6 of the composite backing plate may be joined via diffusion bonding, soldering, brazing, friction stir welding, coating, electroplating, and other methods.

It is apparent then that the present invention is directed toward a method of producing a sputter target assembly. In one embodiment, the method comprises the steps of providing a backing plate composed of a first layer having a first CTE and a second layer having a second CTE. A sputtering target is provided with a surface layer comprising material to be sputtered onto the desired substrate and an underlayer adapted to mate with the top surface of the first backing plate layer 4. The target is composed of a third material having a third CTE. The backing plate and target are solder bonded along the interfacial surfaces, i.e., bottom of the target to top surface of layer 4. In some embodiments, the first layer 4 of the backing plate as shown in the drawings, may be selected from the group consisting of Ti, Mo, Nb, Ta, Zr, and alloys thereof.

In other exemplary embodiments, the second material, material 6 shown in the drawings may be selected from the group consisting of Al, Cu, Ti, Ni, V, and alloys thereof. In other aspects of the invention, the target material may be selected from the group consisting of Si, Si—Ge, silicide, W, Ti—W, Ti—Al, Ta, Co, Ni, Cu, rare earth metals, and alloys thereof, and ceramic materials including, but not limited to oxide, nitride, carbide, and carbon nitrides.

In accordance with certain embodiments of the invention, the CTE of the first material 4 of the backing plate assembly is lower than the CTE of the second material 6 of the backing plate assembly. In certain embodiments, the CTE for layer 6 is about 2-5 times the CTE of layer 4. Stated differently, the ratio CTE layer 6/CTE layer 4 is about 2-5:1. The first and second materials 4 and 6 of the backing plate assembly can be joined together via diffusion bonding, brazing, soldering, friction stir welding, coating, electroplating, and other methods. Additionally, thermal plastic deformation can be applied to the backing plate assembly to achieve a flat first mating surface for the joint assembly of the materials 4, 6.

In other aspects of the invention, a sputter target assembly is provided that comprises a backing plate with a first mating surface. The backing plate is composed of a first material having a first CTE and a second material having a second CTE. A sputter target with a second mating surface is provided, and the sputter target is composed of a third material having a third CTE. The target material is solder bonded to the backing plate along the first and second mating surfaces. The first material, 4, as shown in the drawings may be selected from the group consisting of Ti, Mo, Nb, Ta, Zr, and alloys thereof. Further, the second material, material 6, as shown in the drawings is selected from the group consisting of Al, Cu, Ti, Ni, V, and alloys thereof. The target may be composed of silicon, silicon-germanium, silicide, tungsten, titanium-tungsten, titanium-aluminum, tantalum, cobalt, nickel, copper, rare earth metals, and alloys thereof, and ceramic materials including and not limited to oxide, nitride, carbide, and carbonitride. In further embodiments, the target material may be intrinsic, p-type silicon or n-type silicon, and in other embodiments, the target material may be a single crystal silicon or polycrystalline silicon.

It is apparent then that the present invention is capable of creating a composite backing plate with a low deflection to match the target materials, especially for low CTE brittle target materials. The provision of a component, such as a plural layer backing plate assembly reduces costs and provides for the provision of an inexpensive backing plate.

In accordance with another aspect of the invention, the thickness ratio of the backing plate components TA/TB (see FIG. 5) is adjusted to adjust the depth of the reservoir 10 such as that shown in FIG. 2. In one example in which Ti is provided as the first material 4, with Al6061 utilized as the second material 6 for the backing plate assembly, a TA/TB ratio of 1:1 was provided. This Ti/Al6061 laminated backing plate was diffusion bonded together and a downward displacement of about 0.1 inch was observed at the center of the target. In another exemplary embodiment, Ti was again used as the first material 4 with Al6061 utilized as the second material 6. However, the TA/TB ratio was chosen to be on the order of about 5:1. In this case, the maximum downward displacement or bowing at the center of the assembly was found to be 0.04 inches. Exemplary TA/TB thickness ratios are on the order of about 1:1 to about 100:1.

While we have shown and described herein certain embodiments of the present invention, it is intended that these be covered as well changes or modifications therein which may be made without departing from the spirit and scope of the invention as defined in the appended claims.

What is claimed is:

1. A method of producing a sputter target assembly, said method comprising the steps of:
    a. providing a backing plate composed of a laminated assembly comprising a first layer having a first coefficient of thermal expansion (CTE) and a second layer having a second CTE;
    b. providing a sputtering target, said target composed of a third material having a CTE wherein the CTE of said second layer is about 2-5 times greater than the CTE of said first layer and the difference between the CTE of said third material and said first layer is about 7 or less;
    c. heating said first and second layers thereby forming a concavity along a top surface of said first layer;

d. providing a liquid bonding medium in said concavity and bonding said target to said first layer along said concavity to provide said sputtering target assembly.

2. The method as recited in claim 1 wherein said first layer has a thickness TA and said second layer has a thickness TB; wherein TA:TB is from about 1:1 to about 100:1.

3. The method as recited in claim 2 wherein said target consists essentially of Si, said first layer consists essentially of Ti and said second layer consists essentially of Al or Al alloys.

4. The method as recited in claim 2 wherein said target consists essentially of W or $WSi_2$, said first layer consists essentially of Ti and said second layer consists essentially of Al or Al alloys.

5. The method as recited in claim 2 wherein said target consists essentially of Si, said first layer consists essentially of Mo and said second layer consists essentially of Cu.

6. A method as recited in claim 1 wherein said liquid bonding medium is solder and said step d comprises solder bonding said target to said first layer.

* * * * *